(12) United States Patent
Lee

(10) Patent No.: US 6,987,399 B2
(45) Date of Patent: Jan. 17, 2006

(54) SYSTEMS AND METHOD FOR TESTING AND RECORDING TEMPERATURES OF A CPU

(75) Inventor: Shih-Ying Lee, Tu-Cheng (TW)

(73) Assignee: Hon Hai Precision Industry Co., Ltd., (TW)

( * ) Notice: Subject to any disclaimer, the term of this patent is extended or adjusted under 35 U.S.C. 154(b) by 66 days.

(21) Appl. No.: 10/990,999

(22) Filed: Nov. 17, 2004

(65) Prior Publication Data

US 2005/0140385 A1    Jun. 30, 2005

(30) Foreign Application Priority Data

Dec. 26, 2003   (TW)   .............................. 92137057 A

(51) Int. Cl.
  *G01R 31/02*   (2006.01)
  *G01R 31/28*   (2006.01)
  *G01K 11/00*   (2006.01)
(52) U.S. Cl. ...................... 324/760; 702/130; 714/724; 374/104
(58) Field of Classification Search ................ 324/760; 702/130; 374/104
  See application file for complete search history.

(56) References Cited

U.S. PATENT DOCUMENTS 5,107,498 A * 4/1992 Hagihara et al. .............. 714/36
5,502,838 A * 3/1996 Kikinis ........................ 713/501
6,091,255 A * 7/2000 Godfrey ...................... 324/760
6,418,393 B1   7/2002 Lu et al.
2002/0140446 A1 * 10/2002 Kung .......................... 324/760
2003/0097234 A1 *  5/2003 Tanabe ....................... 702/130
2003/0174559 A1 *  9/2003 Cooper et al. .............. 365/200
2005/0075824 A1 *  4/2005 Lee ............................ 702/130

* cited by examiner

*Primary Examiner*—Nestor Ramirez
*Assistant Examiner*—Emily Y Chan
(74) *Attorney, Agent, or Firm*—Morris Manning & Martin; Tim Tingkang Xia, Esq.

(57) ABSTRACT

A system for testing and recording temperatures of a central processing unit (CPU) includes a temperature detecting unit (11) for detecting a current temperature of the CPU at a test time; a temperature data storing unit (12) for storing test results at different test times; a temperature data processing unit (13) for generating test results and comparison results; a temperature monitoring unit (14) for receiving the comparison results and transmitting corresponding control signals; and a test result outputting unit (15) for displaying an indicator light denoting a grading of the CPU and outputting the test results. The temperature data processing unit includes: a temperature data storing module (21), a temperature data obtaining module (22), a temperature setting module (23), a temperature comparing module (24), a test time setting module (25), a testing period comparing module (26), and a test result outputting module (27). A related method is also disclosed.

14 Claims, 3 Drawing Sheets

| Test Time | Current Temperature | Elapsed Testing Period |
|---|---|---|
| | | |
| | | |
| | | |

301 303 305

SYSTEMS AND METHOD FOR TESTING AND RECORDING TEMPERATURES OF A CPU

BACKGROUND OF THE INVENTION

1. Field of the Invention

The present invention relates to industrial and commercial testing and recording systems and methods, and particularly to a system and method for testing and recording temperatures of a central processing unit (CPU).

2. Related Art of the Invention

Integrated circuit devices comprise many circuit elements arranged compactly in a single physical structure (i.e., a "chip"). When processing electrical signals in operation, these chips tend to generate heat. The amount of heat generated by an integrated circuit depends on several factors, including the density of circuit elements on the chip, the signal switching speed, and the signal power. Chips used in apparatuses such as computers are likely to generate large amounts of heat. This is because the integrated circuits generally comprise a very large number of circuit elements (i.e., transistors) arranged on the chip, and the circuit elements are generally operated at high signal switching speeds. The CPU of a personal computer is a quintessential example of this kind of chip.

The CPU can include thousands, or hundreds of thousands, or even millions of transistors in a single package. Each transistor generally acts as a switch, and operates in one of two states: conducting and non-conducting. Most of the electrical current that flows through a transistor does so while the transistor changes from the conducting to non-conducting state, or vice versa.

The transistors in the CPU change states synchronously with a clock signal. Thus the transistors in a typical 400 MHz CPU (i.e., a CPU operating from a 400 MHz clock signal) change states 800 million times per second. Of course, not every transistor in the CPU changes state on every edge of every cycle of the clock signal; some or even many transistors may remain in a given state throughout multiple clock signals. Nevertheless, in the typical CPU, much current flows through the numerous transistors at an extremely high rate each second. Overheating of a CPU not only risks shortening the useful lifetime of the CPU, but also can lead to failure of the computer system. Overheating of CPUs has been a significant problem for many years already. Further, it is generally accepted that the operating speed capabilities of CPUs will continue to increase in future, and that the problem of overheating of CPUs is likely to loom even larger.

For each particular kind of CPU marketed, a CPU manufacturer specifies a predetermined temperature range within which the CPU can operate properly and safely. If the actual operating temperature falls outside the predetermined range, the CPU may not function correctly, and the performance of the computer system may be impaired. For quality control, it is desirable that a CPU manufacturer employs a fast and efficient system and/or method for testing and recording temperatures of a newly manufactured CPU.

SUMMARY OF THE INVENTION

A main objective of the present invention is to provide a system and method which can efficiently test and record temperatures of a CPU at different points in time.

To accomplish the above objective, a system for testing and recording temperatures of a CPU in accordance with a preferred embodiment of the present invention comprises: a temperature detecting unit for detecting a current temperature of the CPU; a temperature data storing unit for storing test results; a temperature data processing unit for generating test results and comparison results; a temperature monitoring unit for receiving the comparison results and transmitting corresponding control signals; and a test result outputting unit for displaying an indicator light and outputting the test results. The temperature data processing unit comprises a temperature data storing module, a temperature data obtaining module, a temperature setting module, a test time setting module, a temperature comparing module, a testing period comparing module, and a test result outputting module.

The temperature data storing module is for storing the test results in the temperature data storing unit. The temperature data obtaining module is for obtaining the test results from the temperature data storing unit. The temperature setting module is for setting a safe maximum threshold temperature for the CPU. The test time setting module is for setting a standard testing period and a test mode. The temperature comparing module is for comparing the current temperature of the CPU with the maximum threshold temperature and transmitting corresponding comparison results. The testing period comparing module is for comparing an elapsed testing period with the standard testing period and transmitting corresponding comparison results, if the current temperature is not higher than the maximum threshold temperature and the elapsed testing period is not equal to the standard testing period. The test result outputting module is for outputting the test results and the comparison results.

Further, the present invention provides a method for testing and recording temperatures of a CPU, the method comprising the steps of: (a) setting a safe maximum threshold temperature for the CPU; (b) setting a standard testing period and a test mode; (c) detecting a current temperature of the CPU and transmitting a test result to a temperature data processing unit; (d) storing the test result to a temperature data storing unit; (e) comparing the current temperature of the CPU with the maximum threshold temperature; (f) transmitting a control signal to cease operation of the CPU, and displaying a red indicator light to denote the CPU is unsatisfactory and outputting the test result, if the current temperature is higher than the maximum threshold temperature; (g) comparing an elapsed testing period with the standard testing period, if the current temperature is not higher than the maximum threshold temperature; (h) continuing to compare a next temperature with the maximum threshold temperature, if the elapsed testing period is not equal to the standard testing period; and (i) transmitting a control signal to cease operation of the CPU, and displaying a green indicator light to denote the CPU is satisfactory and outputting the test result, if the elapsed testing period is equal to the standard testing period.

Other objects, advantages and novel features of the present invention will be drawn from the following detailed description with reference to the attached drawings, in which:

DETAILED DESCRIPTION OF THE INVENTION

Figure 1:
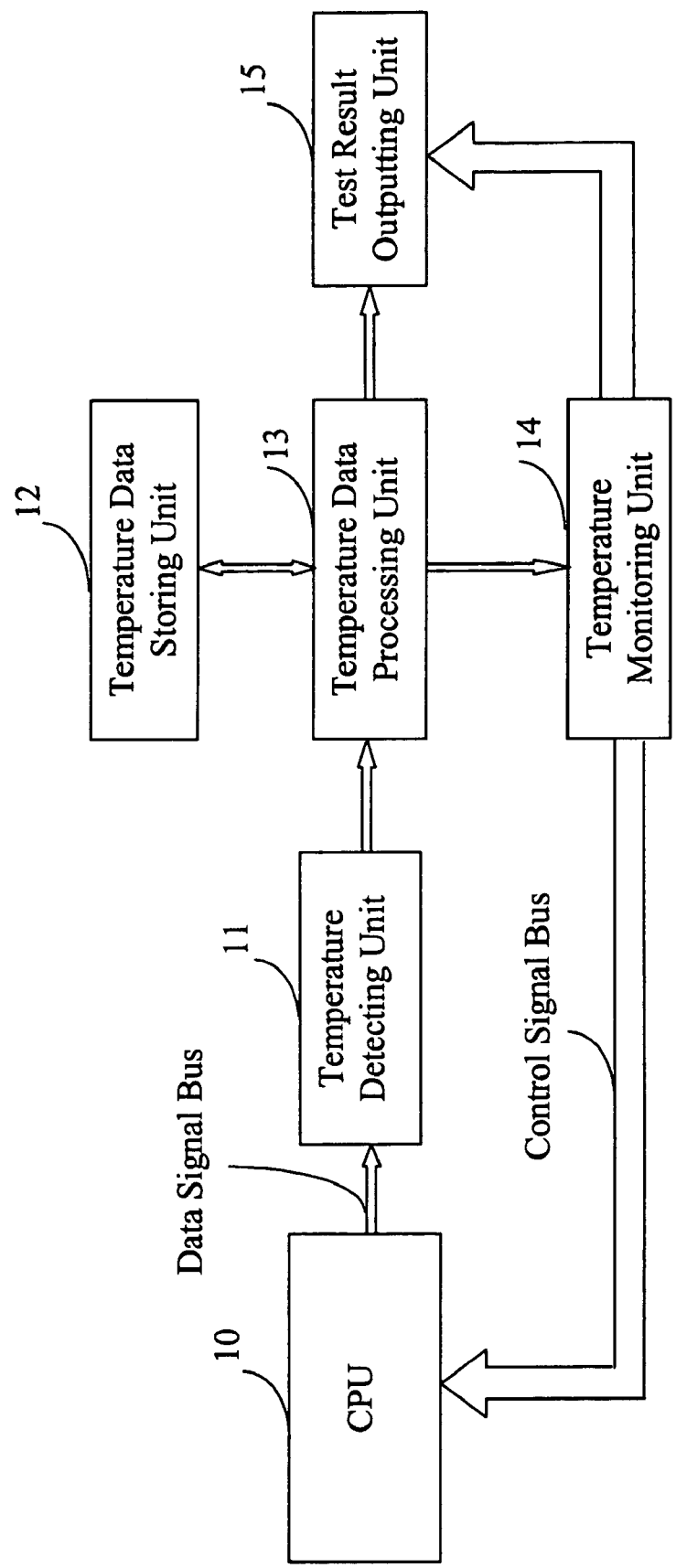
FIG. 1 is a block diagram of hardware infrastructure of a system for testing and recording temperatures of a CPU in accordance with the preferred embodiment of the present invention.

FIG. 1 is a block diagram of hardware infrastructure of a system for testing and recording temperatures of a central processing unit (CPU) (hereinafter, "the system") in accordance with the preferred embodiment of the present invention. The system comprises a CPU 10 to be tested, a temperature detecting unit 11, a temperature data storing unit 12, a temperature data processing unit 13, a temperature monitoring unit 14, and a test result outputting unit 15. The temperature data processing unit 13 is connected to the CPU 10, the temperature detecting unit 11, the temperature data storing unit 12, the temperature monitoring unit 14 and the test result outputting unit 15 through a data signal bus (represented by thin lines). Further, the temperature monitoring unit 14 is connected to the CPU 10 and the test result outputting unit 15 through a control signal bus (represented by thick lines).

The temperature detecting unit 11 utilizes a thermistor (not shown) to detect a current temperature of the CPU 10 at a test time, and transmits the current temperature to the temperature data processing unit 13. The test time is a point in time when the CPU 10 is tested. The thermistor is closely coupled with the CPU 10, and detects a temperature change of the CPU 10 through a corresponding change in electrical resistance.

The temperature data processing unit 13 receives the current temperature of the CPU 10, and generates a corresponding test result including the test time, the current temperature and an elapsed testing period up to the current time. The temperature data processing unit 13 also compares the current temperature with a safe maximum threshold temperature of the CPU 10, compares the elapsed testing period with a standard testing period, and transmits a corresponding comparison result to the temperature monitoring unit 14.

The temperature data storing unit 12 is a memory for storing test results at different test times in a data record list (described below in relation to FIG. 3). The data record list may have a structured query language data format, an Oracle data format, or any other suitable data format.

The temperature monitoring unit 14 generates and transmits a corresponding control signal to control operation of the CPU 10 and the test result outputting unit 15, according to the comparison result received from the temperature data processing unit 13.

The test result outputting unit 15 displays an indicator light denoting a grading of the CPU 10 according to the control signal, and outputs the test result. For example, when the test result outputting unit 15 displays a red indicator light, the CPU 10 is regarded as unsatisfactory. In contrast, when the test result outputting unit 15 displays a green indicator light, the CPU 10 is regarded as satisfactory.

Figures 2, 3:
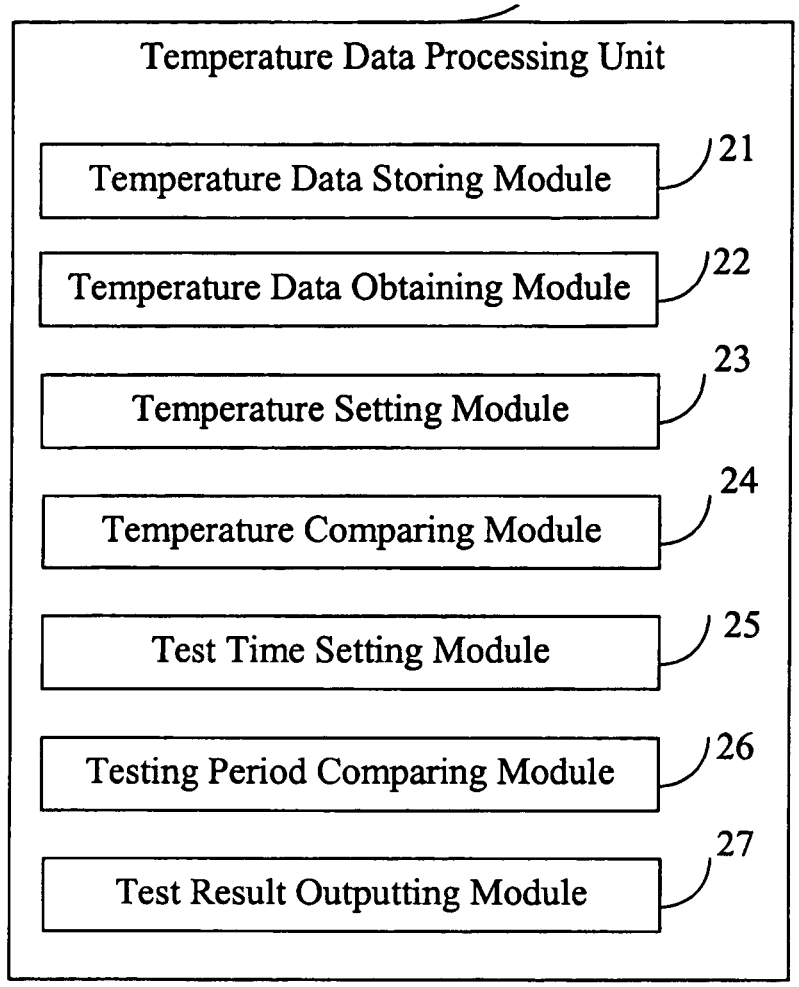
FIG. 2 is a schematic diagram of main function modules of a data processing unit of the system of FIG. 1.
FIG. 3 illustrates an exemplary data record list, in accordance with the present invention.

FIG. 2 is a schematic diagram of main function modules of the temperature data processing unit 13. The temperature data processing unit 13 comprises a temperature data storing module 21, a temperature data obtaining module 22, a temperature setting module 23, a temperature comparing module 24, a test time setting module 25, a testing period comparing module 26, and a test result outputting module 27.

The temperature data storing module 21 stores test results of the CPU 10 at different test times in a data record list (described below in relation to FIG. 3) in the temperature data storing unit 12. The temperature data obtaining module 22 obtains the test results from the temperature data storing unit 12, and transmits the test results to the test result outputting module 27.

The temperature setting module 23 sets a safe maximum threshold temperature for the CPU 10. The temperature comparing module 24 compares a current temperature of the CPU 10 obtained from the temperature detecting unit 11 with the maximum threshold temperature, generates a first comparison result, and transmits the first comparison result to the temperature monitoring unit 14. If the first comparison result indicates that the current temperature is higher than the maximum threshold temperature, the temperature monitoring unit 14 transmits a halt control signal to cease operation of the CPU 10. Further, the test result outputting unit 15 displays a red indicator light according to the control signal denoting that the CPU 10 is unsatisfactory, and outputs the test result. Alternatively, if the first comparison result indicates that the current temperature is not higher than the maximum threshold temperature, the temperature comparing module 24 continues to compare the maximum threshold temperature with a next temperature obtained at a next test time by the temperature detecting unit 11.

The test time setting module 25 sets a standard testing period and a test mode for the CPU 10, and times an elapsed testing period. For example, the standard resting period can be set as 30 minutes, and the test mode can be tat the CPU 10 is tested every 5 minutes throughout the standard testing period. The testing period comparing module 26 compares an elapsed testing period obtained from the test time setting module 25 with the standard testing period and generates a second comparison result, if the current temperature is not higher than the maximum threshold temperature and the elapsed testing period is not equal to the standard testing period. If the second comparison result indicates that the elapsed testing period is equal to the standard resting period, the temperature monitoring unit 14 transmits a halt control signal to cease operation of the CPU 10, and the test process is finished, Further, the test result outputting unit 15 displays a green indicator light denoting that the CPU 10 is satisfactory, and outputs the test result. Alternatively, if the second comparison result indicates that the elapsed testing period is not equal to the standard testing period, the temperature comparing module 24 continues to compare the maximum threshold temperature with a next temperature obtained at a next test rime by the temperature detecting unit 11.

The test result outputting module 27 outputs the comparison results to the temperature monitoring unit 14, and outputs the test results to the test result outputting unit 15.

FIG. 3 illustrates an exemplary data record list that stores test results obtained at different test times. The data record list comprises three columns: test time 301, current temperature 303, and elapsed testing period 305. Each entry under test time 301 records a point in time when the CPU 10 is tested. Each entry under current temperature 303 records a temperature of the CPU 10 at a corresponding test time 301. Each entry under elapsed testing period 305 records an elapsed testing period as at the corresponding test time 301.

Figure 4:
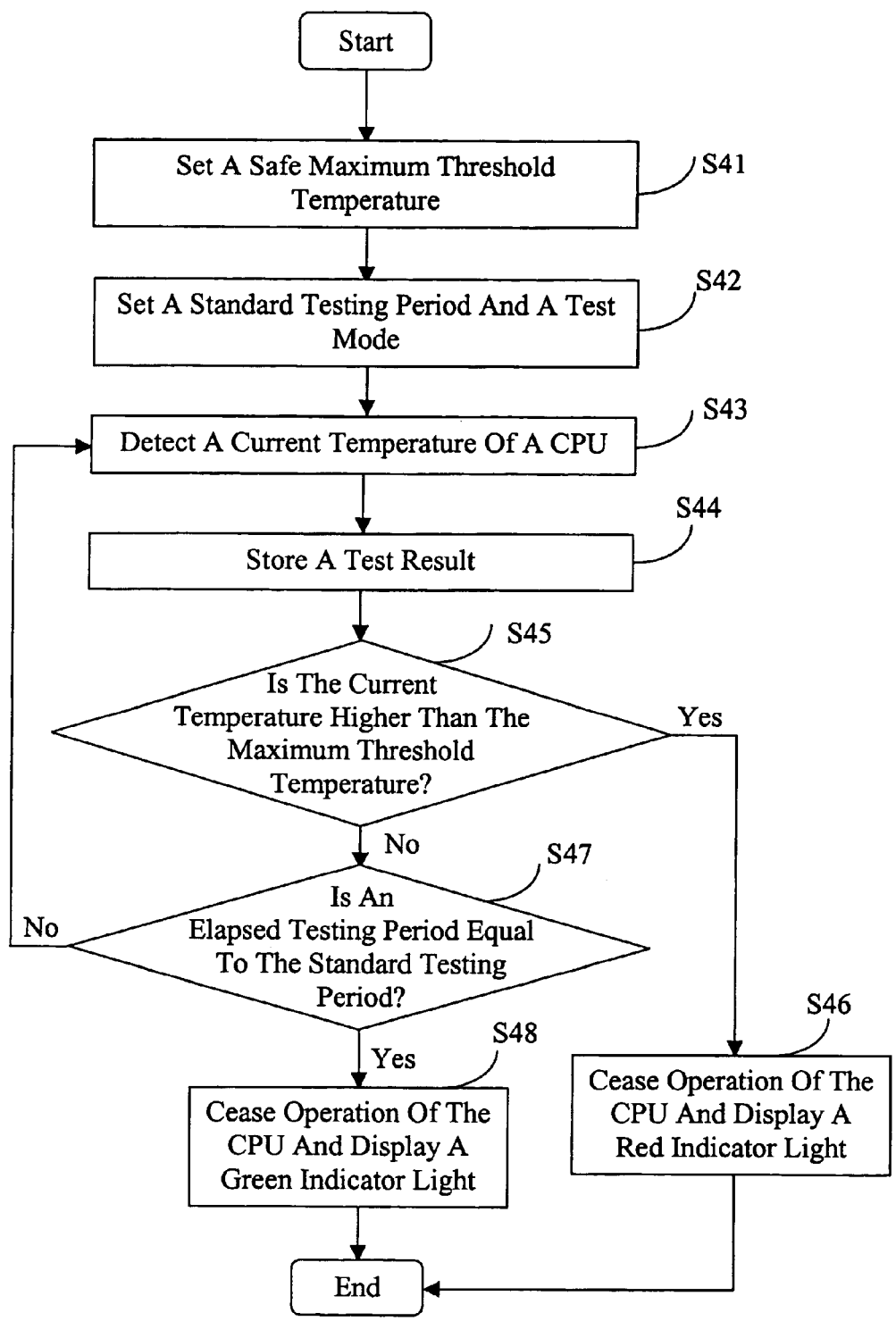
FIG. 4 is a flowchart of a preferred method for implementing the system of FIG. 1.

FIG 4 is a flowchart of a preferred method for implementing the system. In step S41, the temperature setting module 23 sets a safe maximum threshold temperature for the CPU 10. In step S42, the test time setting module 25 sets a standard testing period and a test mode, and starts timing an elapsed testing period. In step S43, the temperature detecting unit 11 detects a current temperature of the CPU 10 at a test time according to the test mode, and generates and transmits a corresponding test result to the temperature data processing unit 13. In step S44, the temperature data storing module 21 stores the test result in a data record list in the temperature data storing unit 12. In step S45, the temperature comparing module 24 compares the current temperature with the maximum threshold temperature, and transmits a first comparison result to the temperature monitoring unit 14.

If the first comparison result indicates that the current temperature is higher than the maximum threshold temperature, in step S46, the temperature monitoring unit 14 transmits a halt control signal to cease operation of the CPU 10. Further, the test result outputting unit 15 displays a red indicator light according to the control signal denoting that the CPU 10 is unsatisfactory and outputs the test result, whereupon the procedure is finished. Alternatively, if the first comparison result indicates that the current temperature is not higher than the maximum threshold temperature, in step S47, the testing period comparing module 26 compares an elapsed testing period with the standard testing period, and generates and transmits a second comparison result to the temperature monitoring unit 14.

If the second comparison result indicates that the elapsed testing period is not equal to the standard testing period, the procedure returns to step S43 described above. In contrast, if the second comparison result indicates that the elapsed testing period is equal to the standard testing period, in step S48, the temperature monitoring unit 14 transmits a halt control signal to cease operation of the temperature detecting unit 11. Also, the test result outputting unit 15 displays a green indicator light denoting that the CPU 10 is satisfactory, and outputs the test result, whereupon the procedure is finished.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. A system for testing and recording temperatures of a central processing unit (CPU), comprising:
    a temperature detecting unit for detecting a current temperature of the CPU at a test time;
    a temperature data storing unit for storing test results at different test times;
    a temperature data processing unit for generating test results according to detected temperatures and generating comparison results, the temperature data processing unit comprising:
        a temperature data storing module for storing the test results in the temperature data storing unit;
        a temperature data obtaining module for obtaining the test results from the temperature data storing unit;
        a temperature setting module for setting a safe maximum threshold temperature for the CPU;
        a temperature comparing module for comparing the current temperature of the CPU retrieved from the temperature detecting unit with the maximum threshold temperature;
        a test time setting module for setting a standard testing period and a test mode, and for timing an elapsed testing period;
        a testing period comparing module for comparing the elapsed testing period obtained from the test time setting module with the standard testing period; and
    a temperature monitoring unit for receiving the comparison results generated by the temperature comparing module and the testing period comparing module, and for generating and transmitting corresponding control signals to control operation of the CPU.

2. The system for testing and recording temperatures of a CPU according to claim 1, further comprising a test result outputting unit for displaying an indicator light denoting a grading of the CPU and outputting the test results.

3. The system for testing and recording temperatures of a CPU according to claim 1, wherein the temperature data processing unit further comprises a test result outputting module for outputting the test results and the comparison results.

4. The system for testing and recording temperatures of a CPU according to claim 3, wherein each of the test results comprises a test time, a current temperature of the CPU, and an elapsed testing period.

5. The system for testing and recording temperatures of a CPU according to claim 1, wherein the test time is a point in time when the CPU is tested according to the test mode.

6. The system for testing and recording temperatures of a CPU according to claim 1, wherein the current temperature is a temperature of the CPU at a corresponding test time.

7. The system for testing and recording temperatures of a CPU according to claim 1, wherein the elapsed testing period is a period for which the CPU has been tested up to a current time.

8. The system for testing and recording temperatures of a CPU according to claim 2, wherein the test result outputting unit displays a red indicator light to denote that the CPU is unsatisfactory.

9. The system for testing and recording temperatures of a CPU according to claim 2, wherein the test result outputting unit displays a green indicator light to denote that the CPU is satisfactory.

10. A method for testing and recording temperatures of a central processing unit (CPU), the method comprising the steps of:
    setting a safe maximum threshold temperature for the CPU;
    setting a standard testing period and a test mode;
    timing to retrieve an elapsed testing period;
    detecting a current temperature of the CPU at a test time, and transmitting a test result to a temperature data processing unit;
    storing the test result in a temperature data storing unit;
    comparing the current temperature of the CPU with the maximum threshold temperature;
    ceasing operation of the CPU, and displaying a red indicator light to denote the CPU is unsatisfactory and outputting the test result, if the current temperature is higher than the maximum threshold temperature;
    comparing the elapsed testing period with the standard testing period, if the current temperature is not higher than the maximum threshold temperature;
    continuing to compare a next temperature obtained at a next test time with the maximum threshold temperature, if the elapsed testing period is not equal to the standard testing period; and ceasing operation of the CPU, and displaying a green indicator light to denote the CPU is satisfactory and outputting the test result, if the elapsed testing period is equal to the standard testing period.

11. The method according to claim 10, wherein the test result comprises the current temperature of the CPU, the test time and the elapsed testing period.

12. A method for monitoring and recording temperatures of a central processing unit (CPU), comprising the steps of:
   setting an allowable safe threshold temperature for normal operation of said CPU;
   detecting a current temperature of said CPU to get a test result in a preset period;
   storing said test result in a preset format;
   recording an elapsed testing period so as to continue said detecting step based on a comparative result of said elapsed testing period and said preset period showing said elapsed testing period is smaller than said preset period;
   controlling operation of said CPU based on comparison of said current temperature of said CPU and said safe threshold temperature; and
   displaying an indicator signal to denote conditions of said CPU in said preset period.

13. The method according to claim 12, further comprising the step of setting a test mode before said detecting step to define a detecting way in said preset period.

14. The method according to claim 13, wherein said preset format of said test result comprises a data record list having records of test times, current temperatures and elapsed testing periods.

* * * * *